US012503768B2

(12) United States Patent
Kagaya et al.

(10) Patent No.: US 12,503,768 B2
(45) Date of Patent: Dec. 23, 2025

(54) SUBSTRATE PROCESSING APPARATUS, METHOD OF MANUFACTURING SEMICONDUCTOR DEVICE, METHOD OF PROCESSING SUBSTRATE, AND GAS INJECTOR

(71) Applicant: KOKUSAI ELECTRIC CORPORATION, Tokyo (JP)

(72) Inventors: Toru Kagaya, Toyama (JP); Yoshimasa Nagatomi, Toyama (JP); Madoka Tanaka, Tokyo (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 396 days.

(21) Appl. No.: 17/848,197

(22) Filed: Jun. 23, 2022

(65) Prior Publication Data

US 2023/0055506 A1 Feb. 23, 2023

(30) Foreign Application Priority Data

Aug. 20, 2021 (JP) ................. 2021-134955

(51) Int. Cl.
*C23C 16/455* (2006.01)
*H01L 21/687* (2006.01)
*C23C 16/44* (2006.01)

(52) U.S. Cl.
CPC .. *C23C 16/45578* (2013.01); *C23C 16/45574* (2013.01); *H01L 21/68771* (2013.01); *C23C 16/4412* (2013.01)

(58) Field of Classification Search
CPC ........ C23C 16/45546; C23C 16/45578; C23C 16/45574; H01L 21/68771
See application file for complete search history.

(56) References Cited

U.S. PATENT DOCUMENTS 7,655,111 B2   2/2010  Horiguchi
2004/0025786 A1*  2/2004  Kontani ............ C23C 16/45578
                                                          118/715

(Continued)

FOREIGN PATENT DOCUMENTS

JP   2009-245984 A   10/2009
JP   2013-197329 A    9/2013

(Continued)

OTHER PUBLICATIONS

Japanese Office Action issued on Feb. 7, 2023 for Japanese Patent Application No. 2021-134955.

(Continued)

*Primary Examiner* — Joseph A Miller, Jr.
(74) *Attorney, Agent, or Firm* — Volpe Koenig

(57) ABSTRACT

There is provided a technique that includes a process container where a plurality of substrates to be processed is arranged in an inside of the process container; and a gas injector including a pipe extending along a direction in which the plurality of substrates is arranged, and configured to supply a gas into the process container, wherein the gas injector includes at least one first injection hole installed along a longitudinal direction of the pipe in a section where the plurality of substrates is arranged, and configured to supply the gas, and a plurality of second injection holes having an area smaller than a flow path cross-sectional area of the pipe, and installed to be opened obliquely to the longitudinal direction at a tip of the pipe.

14 Claims, 9 Drawing Sheets

(56) References Cited

U.S. PATENT DOCUMENTS

| | | |
|---|---|---|
| 2014/0357058 A1 | 12/2014 | Takagi et al. |
| 2017/0051408 A1 | 2/2017 | Takagi et al. |
| 2018/0277355 A1 | 9/2018 | Takagi et al. |
| 2019/0186014 A1* | 6/2019 | Kikama ............ H01L 21/67109 |
| 2019/0360098 A1 | 11/2019 | Shimada et al. |
| 2021/0043485 A1 | 2/2021 | Saido et al. |
| 2021/0395893 A1* | 12/2021 | Sakashita .......... C23C 16/45544 |

FOREIGN PATENT DOCUMENTS

| | | |
|---|---|---|
| JP | 2014-063959 A | 4/2014 |
| JP | 2014-236129 A | 12/2014 |
| JP | 2017-028256 A | 2/2017 |
| JP | 2019-110269 A | 7/2019 |
| JP | 2020-205438 A | 12/2020 |
| JP | 2021-028977 A | 2/2021 |
| KR | 10-2021-0060059 A | 5/2021 |
| WO | 2015/045137 A1 | 4/2015 |
| WO | 2018/008088 A1 | 1/2018 |

OTHER PUBLICATIONS

Korean Office Action issued on May 25, 2024 for Korean Patent Application No. 10-2022-0076708.
Singapore Search Report issued on Oct. 24, 2024 for Singapore Patent Application No. 10202250277W.
Singapore Written Opinion issued on Oct. 24, 2024 for Singapore Patent Application No. 10202250277W.

* cited by examiner

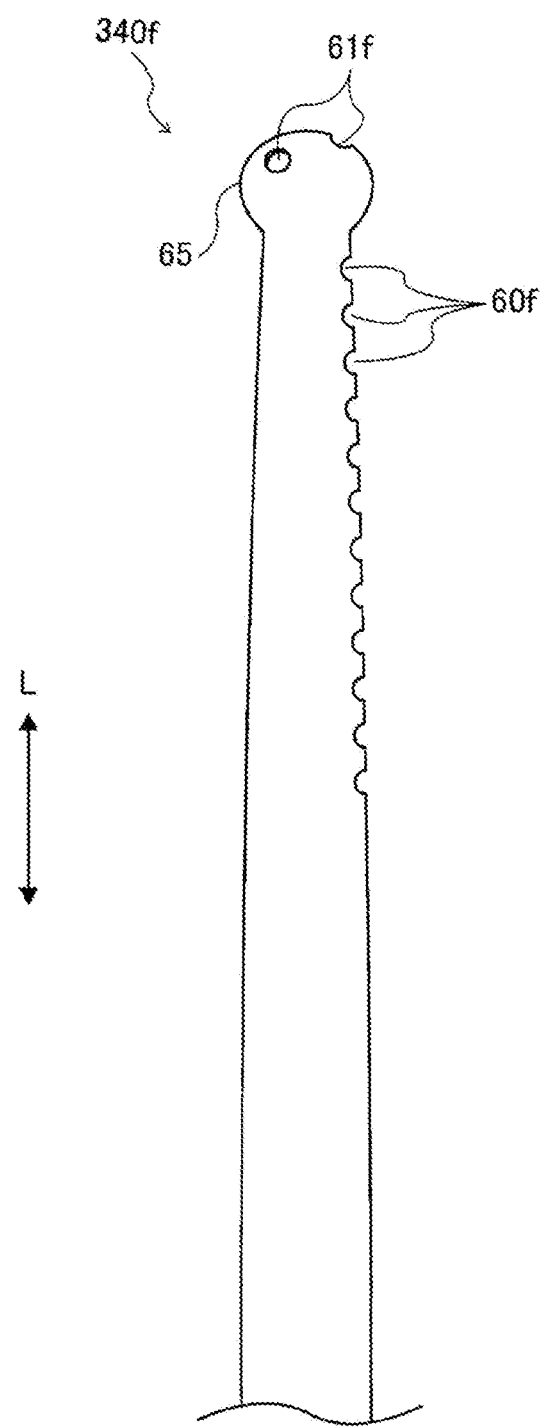

SUBSTRATE PROCESSING APPARATUS, METHOD OF MANUFACTURING SEMICONDUCTOR DEVICE, METHOD OF PROCESSING SUBSTRATE, AND GAS INJECTOR

CROSS-REFERENCE TO RELATED APPLICATION

This application is based upon and claims the benefit of priority from Japanese Patent Application No. 2021-134955, filed on Aug. 20, 2021, the entire contents of which are incorporated herein by reference.

TECHNICAL FIELD

The present disclosure relates to a substrate processing apparatus, a method of manufacturing a semiconductor device, a method of processing a substrate, and a gas injector.

BACKGROUND

In the related art, as a substrate processing apparatus for processing a substrate, there is known a vertical processing apparatus that includes a reaction tube having a process chamber formed therein and performs a substrate processing process by arranging and installing a predetermined number of substrates in the process chamber in the vertical direction, heating the substrates to a predetermined temperature, and supplying a processing gas into the process chamber.

In the process chamber of the substrate processing apparatus, there are arranged a substrate holder for arranging and holding a plurality of substrates, a gas injector having a pipe extending along a substrate arrangement direction and configured to supply a gas into the process chamber, and the like. Further, the pipe of the gas injector is installed with a plurality of injection holes for supplying a gas along the longitudinal direction, and is configured to supply a gas to the plurality of substrates in the process chamber.

However, if a bias in the gas supply amount occurs in the longitudinal direction of the pipe of the gas injector, it may be a factor that deteriorates a film thickness uniformity for each substrate. Therefore, it is desirable to reduce the bias in the gas supply amount.

SUMMARY

Some embodiments of the present disclosure provide a technique capable of making the supply amount of a gas uniform in the longitudinal direction of a pipe of a gas injector in a process chamber.

According to one embodiment of the present disclosure, there is provided a technique that includes a process container where a plurality of substrates to be processed is arranged in an inside of the process container; and a gas injector including a pipe extending along a direction in which the plurality of substrates is arranged, and configured to supply a gas into the process container, wherein the has injector includes: at least one first injection hole installed along a longitudinal direction of the pipe in a section where the plurality of substrates is arranged, and configured to supply the gas; and a plurality of second injection holes having an area smaller than a flow path cross-sectional area of the pipe, and installed to be opened obliquely to the longitudinal direction at a tip of the pipe.

BRIEF DESCRIPTION OF DRAWINGS

The accompanying drawings, which are incorporated in and constitute a part of the specification, illustrate embodiments of the present disclosure.

FIG. 9 is a side view showing a modification of the gas nozzle of the substrate processing apparatus.

DETAILED DESCRIPTION

Figure 1:
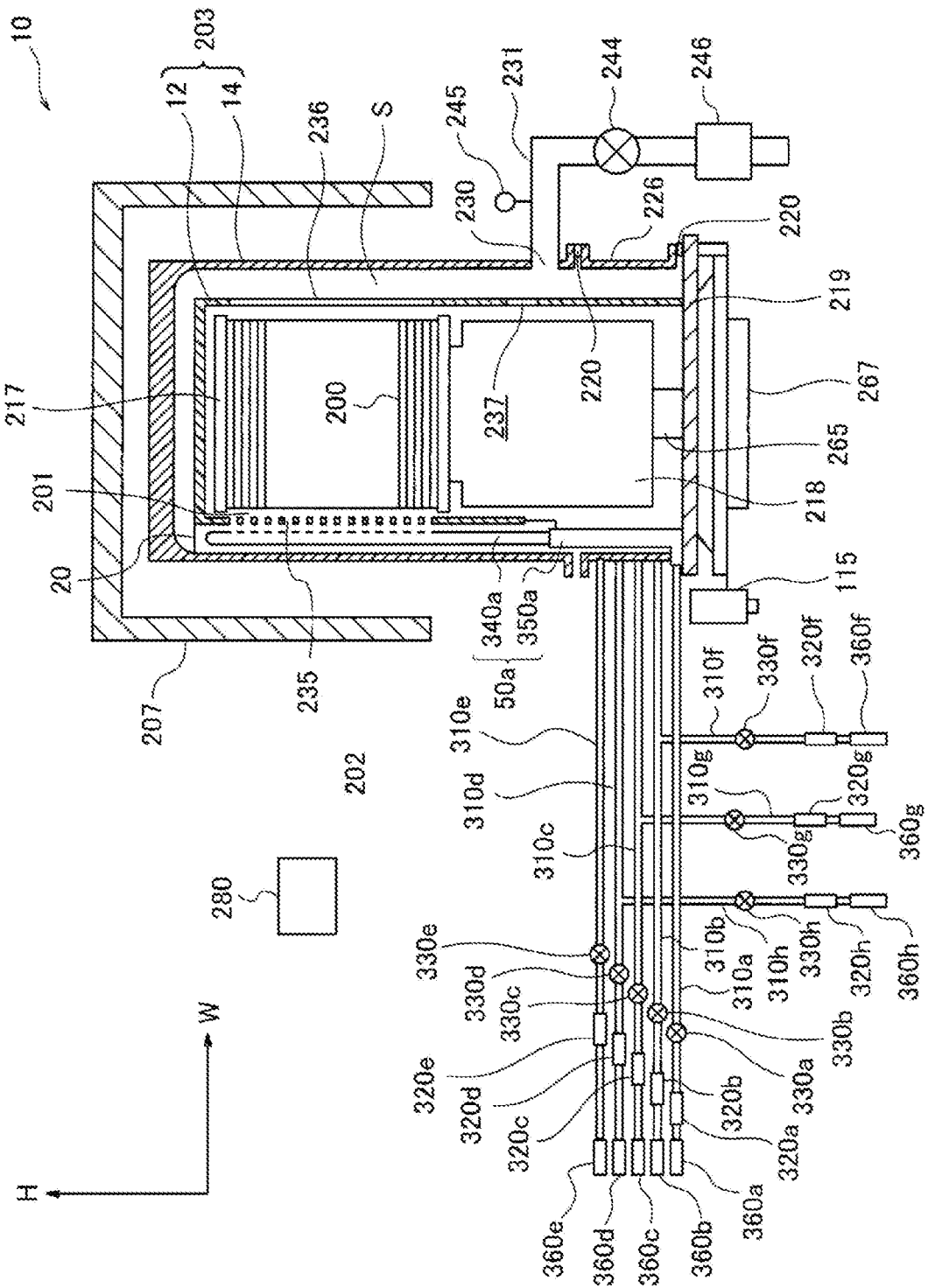
FIG. 1 is a vertical sectional view showing a process furnace of a substrate processing apparatus preferably used in an embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

One Embodiment of the Present Disclosure

Hereinafter, one embodiment of the present disclosure will be described with reference to the drawings. It should be noted that the drawings used in the following description are all schematic, and the dimensional relationship of respective elements, the ratio of respective elements, etc. shown in the drawings do not always match the actual ones. Further, even among a plurality of drawings, the dimensional relationship of respective elements, the ratio of respective elements, etc. may do not match.

An example of the substrate processing apparatus according to the embodiment of the present disclosure will be described with reference to FIGS. 1 to 8. An arrow H shown in the drawings indicates an apparatus height direction (vertical direction), an arrow W indicates an apparatus width direction (horizontal direction), and an arrow D indicates an apparatus depth direction (horizontal direction).

[Overall Configuration of Substrate Processing Apparatus 10]

As shown in FIG. 1, the substrate processing apparatus 10 includes a controller 280 for controlling each part and a process furnace 202. The process furnace 202 has a heater 207 which is a heating means. The heater 207 has a cylindrical shape and is installed in the apparatus height direction by being supported by a heater base (not shown). The heater 207 also functions as an activation mechanism for activating a processing gas with heat. The details of the controller 280 will be described later.

Inside the heater 207, a reaction tube 203 constituting a process container is arranged upright concentrically with the heater 207. The reaction tube 203 is made of a heat-resistant material such as quartz ($SiO_2$) or silicon carbide (SiC). The substrate processing apparatus 10 is of a so-called hot wall type.

As shown in FIG. 1, the reaction tube 203 includes a cylindrical inner tube 12 and a cylindrical outer tube 14 provided so as to surround the inner tube 12. The inner tube 12 is arranged concentrically with the outer tube 14, and a gap S is formed between the inner tube 12 and the outer tube 14. The inner tube 12 is an example of a tube member.

Figure 2:
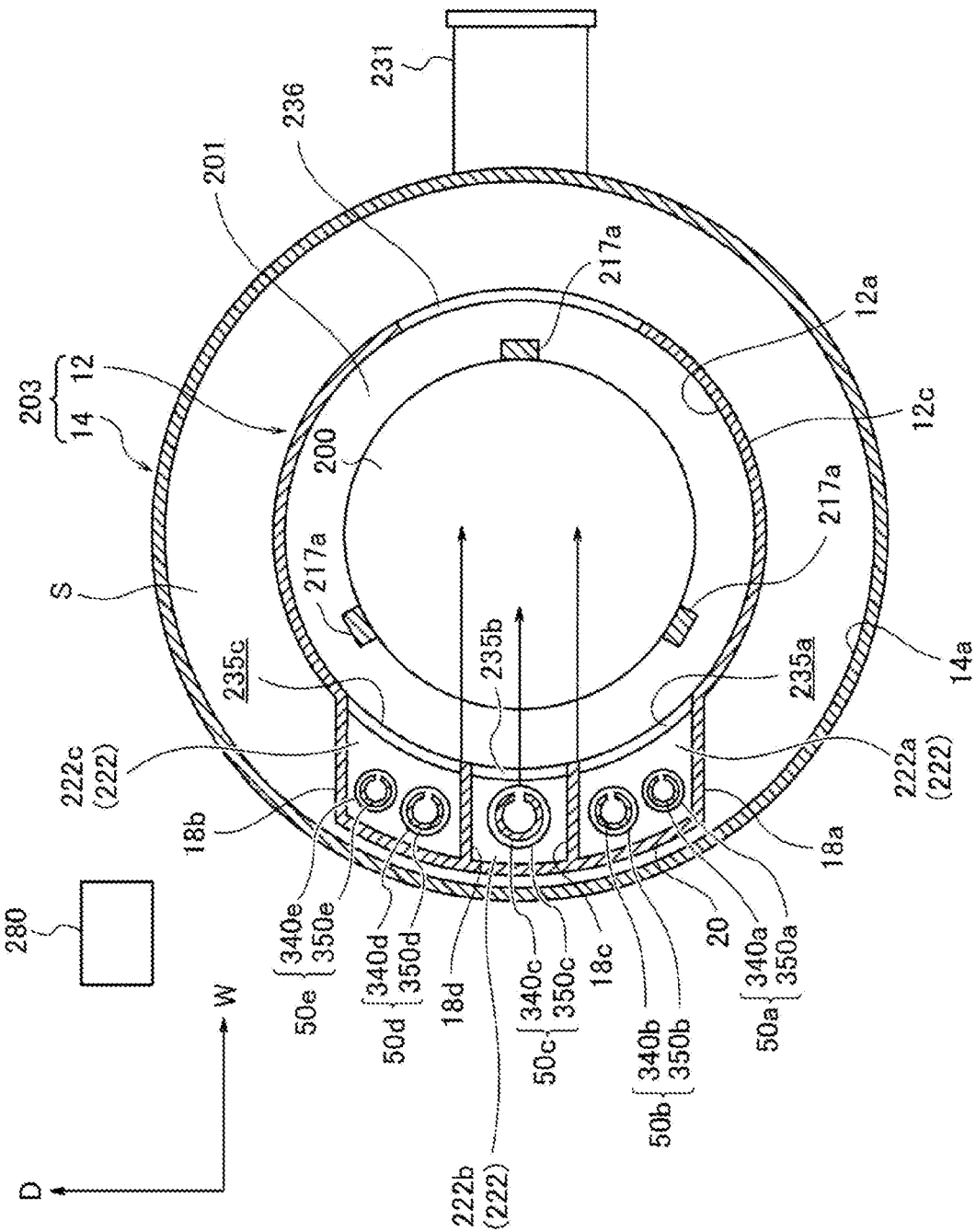
FIG. 2 is a horizontal sectional view showing the process furnace of the substrate processing apparatus.

As shown in FIG. 1, the inner tube 12 is formed in a closed ceiling shape in which a lower end is opened and an upper end is closed by a flat wall body. Further, the outer tube 14 is also formed in a closed ceiling shape in which the lower end is opened and the upper end is closed by a flat wall body. Further, as shown in FIG. 2, nozzle chambers 222 as a plurality of (three, in this embodiment) injector chambers are formed in the gap S formed between the inner tube 12 and the outer tube 14. The details of the nozzle chambers 222 will be described later.

As shown in FIGS. 1 and 2, a process chamber 201 for processing wafers 200 as substrates is installed inside the inner tube 12. Further, the process chamber 201 can accommodate a boat 217, which is an example of a substrate holder capable of holding wafers 200 in a horizontal posture in a vertically arranged state in multiple stages. The inner tube 12 surrounds the accommodated wafers 200. The details of the inner tube 12 will be described later.

The lower end of the reaction tube 203 is supported by a cylindrical manifold 226. The manifold 226 is made of a metal such as nickel alloy or stainless steel, or is made of a heat-resistant material such as quartz or SiC. A flange is formed at the upper end of the manifold 226, and the lower end of the outer tube 14 is installed on the flange. A seal 220 such as an O-ring or the like is arranged between the flange and the lower end of the outer tube 14 to keep the inside of the reaction tube 203 airtight.

A seal cap 219 is airtightly attached to a lower end opening of the manifold 226 via a seal 220 such as an O-ring or the like, and a lower end opening of the reaction tube 203, i.e., an opening of the manifold 226 is airtightly blocked. The seal cap 219 is made of a metal such as nickel alloy or stainless steel, and is formed in a disk shape. An outer surface of the seal cap 219 may be covered with a heat-resistant material such as quartz ($SiO_2$) or silicon carbide (SiC).

A boat support 218 for supporting the boat 217 is installed on the seal cap 219. The boat support 218 is made of a heat-resistant material such as quartz or SiC and functions as a heat insulator.

The boat 217 is erected on the boat support 218. The boat 217 is made of a heat-resistant material such as quartz or SiC. The boat 217 includes a bottom plate (not shown) fixed to the boat support 218, a top plate arranged above the bottom plate, and a plurality of columns 217a (see FIG. 2) installed between the bottom plate and the top plate.

The boat 217 holds a plurality of wafers 200 to be processed in the process chamber 201 in the inner tube 12. The wafers 200 are supported by the support columns 217a of the boat 217 in a horizontal posture while being spaced apart from each other with the centers thereof aligned with each other. The stacking direction of the wafers 200 is the axial direction of the reaction tube 203. That is, centers of the substrates are aligned with the central axis of the boat 217, and a central axis of the boat 217 coincides with a central axis of the reaction tube 203.

A rotator 267 for rotating the boat is installed on a lower side of the seal cap 219. The rotary shaft 265 of the rotator 267 is connected to the boat support 218 through the seal cap 219. The rotator 267 rotates the boat 217 via the boat support 218 to rotate the wafers 200.

The seal cap 219 is vertically raised or lowered by an elevator 115 as an elevating mechanism installed outside the reaction tube 203, whereby the boat 217 can be loaded into and unloaded from the process chamber 201.

Nozzle support portions 350a to 350e that support gas nozzles 340a to 340e for supplying gases into the process chamber 201 are installed in the manifold 226 so as to penetrate the manifold 226 (the nozzle support portion 350a is shown in FIG. 1). In the present embodiment, five nozzle support portions 350a to 350e are installed. The nozzle support portions 350a to 350e are made of, for example, a material such as nickel alloy or stainless steel.

Gas supply pipes 310a to 310e for supplying gases into the process chamber 201 are connected to one ends of the nozzle support portions 350a to 350e, respectively. Further, gas nozzles 340a to 340e as pipes are connected to the other ends of the nozzle support portions 350a to 350e, respectively (the nozzle support portions 350a and the gas nozzle 340a are shown in FIG. 1). The gas injectors 50a to 50e are composed of the gas nozzles 340a to 340e and the nozzle support portions 350a to 350e. The gas nozzles 340a to 340e are made of a heat-resistant material such as quartz ($SiO_2$) or silicon carbide (SiC). The details of the gas nozzles 340a to 340e and the gas supply pipes 310a to 310e will be described later.

Meanwhile, an exhaust port 230 is installed in the outer tube 14 of the reaction tube 203. An exhaust pipe 231 is connected to the exhaust port 230.

A vacuum pump 246 as an evacuation device is connected to the exhaust pipe 231 via a pressure sensor 245 for detecting the pressure inside the process chamber 201 and an APC (Auto Pressure Controller) valve 244 as a pressure regulator. The exhaust pipe 231 on the downstream side of the vacuum pump 246 is connected to a waste gas treatment device (not shown) or the like. As a result, by controlling the output of the vacuum pump 246 and the opening degree of the APC valve 244, the process chamber 201 can be evacuated so that the pressure inside the process chamber 201 becomes a predetermined pressure (vacuum degree).

Further, a temperature sensor (not shown) as a temperature detector is installed inside the reaction tube 203. By adjusting the power supply to the heater 207 based on the temperature information detected by the temperature sensor, the temperature inside the process chamber 201 is adjusted to have a desired temperature distribution.

According to this configuration, in the process furnace 202, the boat 217 for holding the plurality of wafers 200 to be batch-processed in multiple stages is loaded into the process chamber 201 by the boat support 218. Then, the wafers 200 loaded into the process chamber 201 are heated to a predetermined temperature by the heater 207. The apparatus having such a process furnace is called a vertical batch apparatus.

[Main Part Configuration]

Next, the inner tube 12, the nozzle chambers 222, the gas supply pipes 310a to 310e, the gas nozzles 340a to 340e, and the controller 280 will be described in detail.

[Inner Tube 12]

On the peripheral wall of the inner tube 12, there are formed supply slits 235a to 235c, which are examples of supply holes, and first exhaust port 236, which is an example of a discharge part and is configured to face the supply slits 235a to 235c. Further, on the peripheral wall of the inner tube 12, a second exhaust port 237 having a smaller opening area than the first exhaust port 236 is installed below the first exhaust port 236.

As shown in FIG. 1, the first exhaust port 236 installed in the inner tube 12 is formed in a region (hereinafter referred to as "wafer region") extending from the lower end side to the upper end side of the process chamber 201 in which the wafers 200 are accommodated. The second exhaust port 237 is installed below the first exhaust port 236 of the inner tube 12. The first exhaust port 236 is installed so as to bring the process chamber 201 into communication with the gap S, and the second exhaust port 237 is installed to exhaust the atmosphere below the process chamber 201.

Meanwhile, the supply slits 235a to 235c are installed so as to be arranged in the vertical direction between the adjacent wafers 200 placed in multiple stages on the boat 217 accommodated in the process chamber 201.

Further, the supply slits 235a installed on the peripheral wall of the inner tube 12 are installed in a horizontally elongated slit shape in the vertical direction, and are configured to bring the first nozzle chamber 222a (see FIG. 2) into communication with the process chamber 201.

Further, the supply slits 235b are installed in a horizontally elongated slit shape in the vertical direction, and are arranged on the lateral side of the supply slits 235a. In addition, the supply slits 235b bring the second nozzle chamber 222b (see FIG. 2) into communication with the process chamber 201.

Further, the supply slits 235c are installed in a horizontally elongated slit shape in the vertical direction, and are arranged on the opposite side of the supply slits 235a with the supply slits 235b interposed therebetween. In addition, the supply slits 235c bring the third nozzle chamber 222c (see FIG. 2) into communication with the process chamber 201.

[Nozzle Chamber 222]

As shown in FIG. 2, the nozzle chambers 222 are installed in the gap S between the outer peripheral surface 12c of the inner tube 12 and the inner peripheral surface 14a of the outer tube 14. The nozzle chambers 222 include a first nozzle chamber 222a extending in the vertical direction, a second nozzle chamber 222b extending in the vertical direction, and a third nozzle chamber 222c extending in the vertical direction. In addition, the first nozzle chamber 222a, the second nozzle chamber 222b, and the third nozzle chamber 222c are installed side by side in the named order in the circumferential direction of the process chamber 201.

Further, regarding a circumferential length of the process chamber 201, a circumferential length of the second nozzle chamber 222b is shorter than a circumferential length of the first nozzle chamber 222a and a circumferential length of the third nozzle chamber 222c. The first nozzle chamber 222a, the second nozzle chamber 222b, and the third nozzle chamber 222c are examples of injector chambers.

Specifically, the nozzle chambers 222 are installed between a first partition 18a extending from the outer circumferential surface 12c of the inner tube 12 toward the outer tube 14 and a second partition 18b extending from the outer circumferential surface 12c of the inner tube 12 toward the outer tube 14, and between an arcuate top plate 20 and the inner tube 12 that connect the tip of the first partition 18a and the tip of the second partition 18b.

Further, inside the nozzle chambers 222, there are installed a third partition 18c and a fourth partition 18d that extend from the outer circumferential surface 12c of the inner tube 12 toward the top plate 20. The third partition 18c and the fourth partition 18d are arranged side by side from the first partition 18a toward the second partition 18b in the named order. Further, the top plate 20 is spaced apart from the outer tube 14. Moreover, the tip of the third partition 18c and the tip of the fourth partition 18d reach the top plate 20. In addition, the partitions 18a to 18d and the top plate 20 are installed from the ceiling portions of the nozzle chambers 222 to the lower end portion of the reaction tube 203.

As shown in FIG. 2, the first nozzle chamber 222a is installed by being surrounded by the inner tube 12, the first partition 18a, the third partition 18c, and the top plate 20. Further, the second nozzle chamber 222b is installed by being surrounded by the inner tube 12, the third partition 18c, the fourth partition 18d, and the top plate 20. In addition, the third nozzle chamber 222c is installed by being surrounded by the inner tube 12, the fourth partition 18d, the second partition 18b, and the top plate 20.

As a result, each of the nozzle chambers 222a to 222c extends in the vertical direction in a closed ceiling shape in which the lower end is opened and the upper end is closed by the wall body constituting the top surface of the inner tube 12.

As described above, the supply slits 235a that bring the first nozzle chamber 222a into communication with the process chamber 201 are installed on the peripheral wall of the inner tube 12 so as to be arranged in the vertical direction. Further, the supply slits 235b that bring the second nozzle chamber 222b into communication with the process chamber 201 are installed on the peripheral wall of the inner tube 12 so as to be arranged in the vertical direction. In addition, the supply slits 235c that bring the third nozzle chamber 222c into communication with the process chamber 201 are installed on the peripheral wall of the inner tube 12 so as to be arranged in the vertical direction.

[Gas Nozzles 340a to 340e]

The gas nozzles 340a to 340e constituting parts of the gas injectors 50a to 50e extend in the vertical direction, and are installed in the respective nozzle chambers 222a to 222c as shown in FIG. 2. Specifically, the gas nozzle 340a communicating with the gas supply pipe 310a and the gas nozzle 340b communicating with the gas supply pipe 310b are arranged in the first nozzle chamber 222a. Further, the gas nozzle 340c communicating with the gas supply pipe 310c is arranged in the second nozzle chamber 222b. Moreover, the gas nozzle 340d communicating with the gas supply pipe 310d and the gas nozzle 340e communicating with the gas supply pipe 310e are arranged in the third nozzle chamber 222c.

By installing the nozzle chambers 222 for accommodating the gas injectors 50a to 50e in the process chamber 201 and accommodating at least the gas nozzles 340a to 340e of the gas injectors 50a to 50e in the nozzle chambers 222 as described above, it is possible to prevent the gases from being mixed between the respective nozzle chambers 222.

Figure 3:
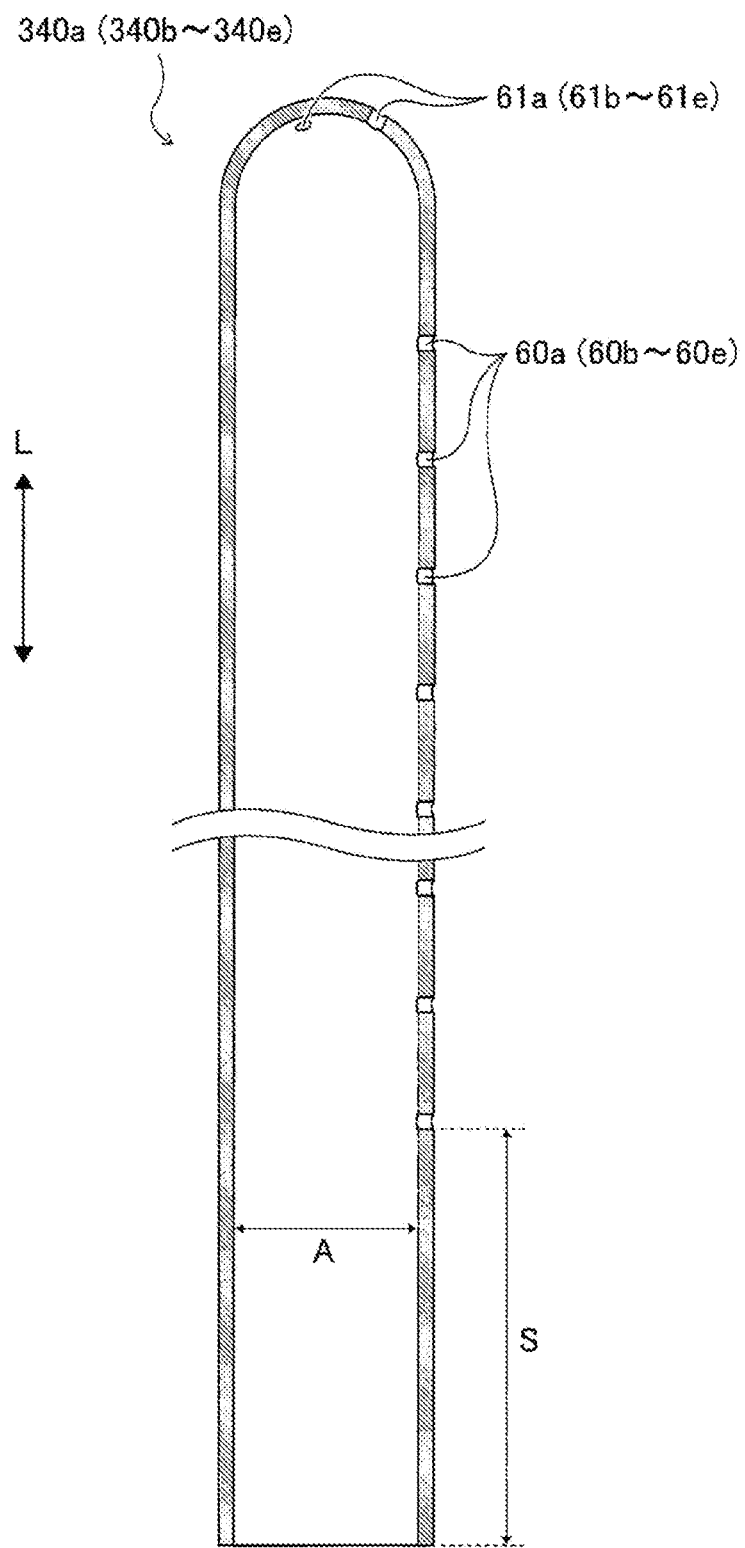
FIG. 3 is a vertical sectional view of a gas nozzle of the substrate processing apparatus.
Figure 4:
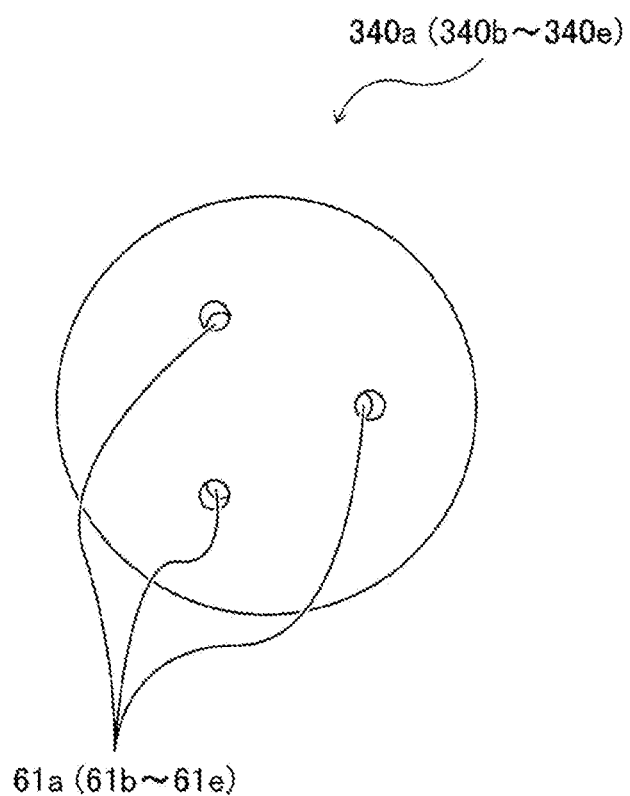
FIG. 4 is a top view of the gas nozzle of the substrate processing apparatus.

As shown in FIGS. 3 and 4, each of the gas nozzles 340a to 340e is configured as a long cylindrical nozzle with a closed tip. Although the gas nozzle 340a is shown as an example in FIGS. 3 and 4, the gas nozzles 340b to 340e have the same configuration except that the thickness of the nozzles is different.

The gas nozzles 340a to 340e are installed in a section where the wafers 200 are arranged along a longitudinal direction L of the gas nozzles 340a to 340e. The gas nozzles 340a to 340e have first injection holes 60a to 60e for supplying gases, and a plurality of second injection holes 61a to 61e installed at tips of the gas nozzles 340a to 340e in an area smaller than a flow path cross-sectional area A of the gas nozzles 340a to 340e so as to be opened obliquely to the longitudinal direction L.

In the present embodiment, the gas nozzles 340a to 340e are long cylindrical nozzles having a constant inner diameter at each position of the gas nozzles 340a to 340e in the longitudinal direction L. Therefore, the flow path cross-sectional area A is the same at each position in the longitudinal direction L. However, if an inner diameter of the gas nozzles 340a to 340e is not constant at each position in the longitudinal direction L and the flow path cross-sectional area A is different at each position in the longitudinal direction L, "an area smaller than the flow path cross-sectional area A of the gas nozzles 340a to 340e" is changed to an area smaller than the smallest flow path cross-sectional area A.

If the gas nozzles 340a to 340e are made of quartz ($SiO_2$), the first injection holes 60a to 60e and the second injection holes 61a to 61e can be installed by a carbon dioxide ($CO_2$) laser. If the outer diameters of the gas nozzles 340a to 340e are small, it is difficult to open the tip portion obliquely to the longitudinal direction L by the carbon dioxide ($CO_2$) laser. However, by setting the outer diameter of the nozzle to a certain size (e.g., Φ18 mm or more), the tip portion can be opened obliquely to the longitudinal direction L by the carbon dioxide ($CO_2$) laser.

Further, the second injection holes 61a to 61e are not limited to those opened perpendicularly to the plane tangential to the surface of the gas nozzles 340a to 340e (i.e., in the wall thickness direction of the gas nozzles 340a to 340e), but may be opened obliquely to the plane tangential to surfaces of the gas nozzles 340a to 340e.

Further, the second injection holes 61a to 61e are not limited to those in which an internal flow path penetrates linearly, but may be those in which the internal flow path penetrates in a non-linear curved manner. In that case, a direction of the openings of the second injection holes 61a to 61e is determined to be a direction of the flow path at the outlet, i.e., the direction perpendicular to the tangential plane at the outlet.

In the conventional gas nozzle, the gas injection holes are installed in the side surface portion, and the gas injection holes are not installed in the tip portion. Therefore, the gas stays near the tip of the gas nozzle, which makes it difficult to make the supply amount of the gas supplied from the injection holes of the side surface portion uniform in the longitudinal direction of the nozzle. Further, if the gas injection holes are not installed at the tip portion, the internal pressure of the gas nozzle becomes high. Therefore, when ozone ($O_3$) is supplied from the gas nozzle, the high internal pressure causes ozone ($O_3$) to be attenuated, which makes it difficult to make the supply amount of ozone ($O_3$) uniform in the longitudinal direction of the nozzle.

On the other hand, the gas nozzles 340a to 340e of the present embodiment are provided with a plurality of second injection holes 61a to 61e at the tips of the gas nozzles 340a to 340e. Therefore, while preventing the gas from staying in the vicinity of the tips of the gas nozzles 340a to 340e, the supply amount of the gas supplied from the first injection holes 60a to 60e can be made uniform in the longitudinal direction of the nozzles without changing the diameters of the first injection holes 60a to 60e from the conventional configuration.

Further, by forming the plurality of second injection holes 61a to 61e at the tips of the gas nozzles 340a to 340e, it is possible to reduce the internal pressure of the gas nozzles 340a to 340e. Therefore, even when ozone ($O_3$) is supplied from the gas nozzles 340a to 340e, the attenuation of ozone ($O_3$) can be suppressed and the supply amount of ozone ($O_3$) can be made uniform in the longitudinal direction of the nozzles.

Further, when the second injection holes 61a to 61e are installed so as to be opened perpendicularly to the longitudinal direction L, the gas is injected from the second injection holes in a state where a flow velocity of the gas is high. However, in the embodiment, the second injection holes 61a to 61e are installed so as to be opened obliquely to the longitudinal direction L. Therefore, the gas flow is deflected in the second injection holes 61a to 61e, and the flow velocity can be slowed down even if the opening area is the same as when the second injection holes 61a to 61e are opened perpendicularly to the longitudinal direction L. As a result, it is possible to suppress an excessive decrease in the internal pressure of the gas nozzles 340a to 340e and an excessive decrease in the flow velocity of the gas injected from the first injection holes 60a to 60e. Therefore, the supply amount of the gas supplied from the first injection holes 60a to 60e can be made uniform in the longitudinal direction of the nozzles.

Now, description will be made on the difference in characteristics when ozone ($O_3$) is supplied from the gas nozzles in the substrate processing apparatus having the above configuration, in a case where the second injection holes are form in the gas nozzles and a case where the second injection holes are not installed in the gas nozzles. In this description, there is shown an example in which the temperature in the process chamber is 400 degrees C., the pressure in the process chamber is 103 Pa, the outer diameter of the gas nozzles is φ18 mm, the opening diameter of the first injection holes of the gas nozzles is φ1.3 mm, and a mixed gas of ozone ($O_3$) and oxygen ($O_2$) is supplied to the gas nozzles at 25 slm.

Figure 5:
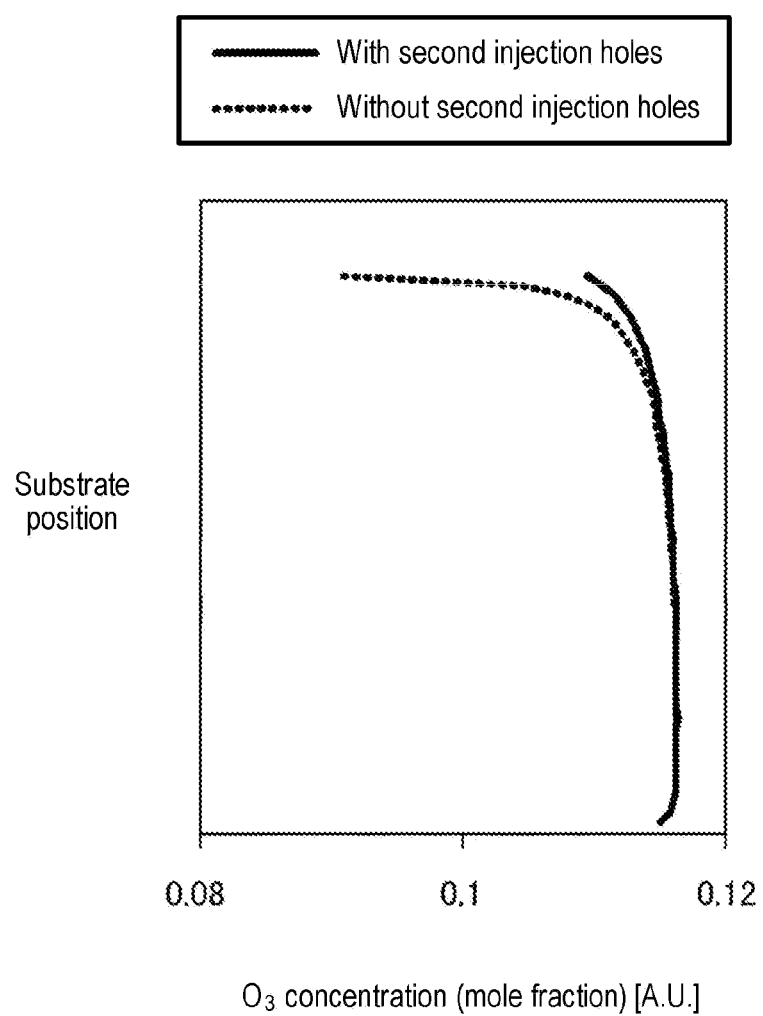
FIG. 5 is a graph which shows the relationship between the substrate position and the ozone ($O_3$) concentration (mole fraction) in the first injection hole of the gas nozzle when a mixed gas of ozone ($O_3$) and oxygen ($O_2$) is supplied to the gas nozzle under conditions determined in the substrate processing apparatus.

FIG. 5 is a graph showing the relationship between the substrate position and the $O_3$ concentration (mole fraction) in the first injection holes of the gas nozzle. The vertical axis of the graph in FIG. 5 indicates the substrate positions of the substrates (wafers) arranged in multiple stages in the vertical direction, wherein the upper side of the graph corresponds to the upper side in the alignment direction (vertical direction), and the lower side of the graph corresponds to the lower side in the alignment direction (vertical direction). The substrate position on the vertical axis indicates a relative position and has no unit. The horizontal axis of the graph in FIG. 5 indicates the ozone ($O_3$) concentration (mole fraction), and the unit thereof is [A. U.]. [A. U.] is an arbitrary unit and indicates the ratio of the measured values in the same measurement system.

As shown in the graph of FIG. 5, it can be noted that the difference in $O_3$ concentration between the upper side and the lower side in an alignment direction of the substrates (vertical direction) is smaller in the gas nozzle with the second injection holes (solid line) than in the gas nozzle without the second injection holes (dotted line). In the case of the gas nozzle without the second injection holes (dotted line), it can be seen that the ozone ($O_3$) concentration decreases remarkably toward the tip of the gas nozzle (the upper side in the vertical axis in the graph).

Figure 6:
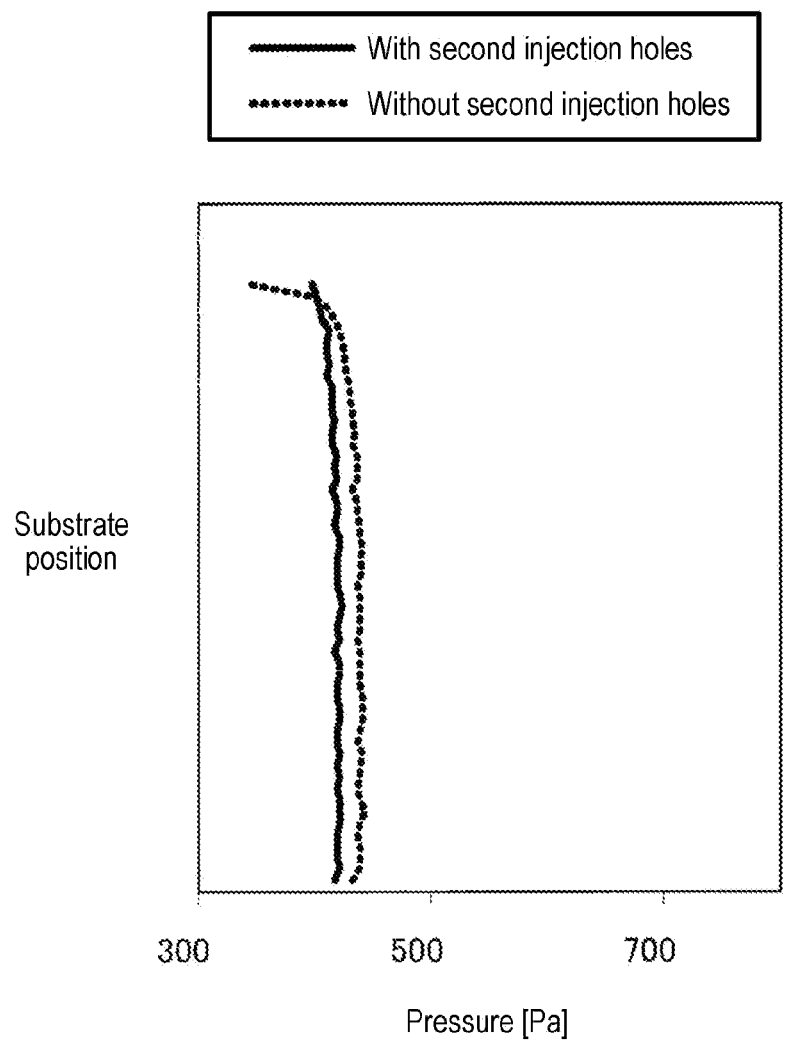
FIG. 6 is a graph which shows the relationship between the substrate position and the pressure in the first injection hole of the gas nozzle when a mixed gas of ozone ($O_3$) and oxygen ($O_2$) is supplied to the gas nozzle under conditions determined in the substrate processing apparatus.

FIG. 6 is a graph showing the relationship between the substrate positions and the pressure in the first injection holes of the gas nozzle. Similar to the graph of FIG. 5, the vertical axis of the graph in FIG. 6 indicates the substrate positions of the substrates (wafers) arranged in multiple stages in the vertical direction and has no unit. The horizontal axis of the graph in FIG. 6 indicates the pressure, and the unit thereof is [Pa].

As shown in the graph of FIG. 6, it can be noted that the pressure is generally lower in the gas nozzle with the second injection holes (solid line) than in the gas nozzle without the second injection holes (dotted line), but the pressure difference between the upper side and the lower side in the alignment direction of the substrates (vertical direction) is small. In the case of the gas nozzle without the second injection holes (dotted line), it can be seen that the pressure decreases remarkably toward the tip of the gas nozzle (the upper side in the vertical axis in the graph).

That is, it can be noted from the graphs of FIGS. 5 and 6 that the gas nozzle with the second injection holes can suppress the attenuation of ozone ($O_3$) and can stably supply ozone ($O_3$) over the entire alignment direction of the substrates (vertical direction), as compared with the gas nozzle without the second injection holes.

Further, the tips of the gas nozzles 340a to 340e are installed of a hemispherical ceiling, and the second injection holes 61a to 61e are arranged at positions other than the tips of the ceiling in a rotationally symmetric manner with the longitudinal direction L as a symmetry axis.

With such a configuration, a deviation of the internal pressure of the gas nozzles 340a to 340e can be reduced, which makes the supply amount of the gas supplied from the first injection holes 60a to 60e uniform in the longitudinal direction of the nozzles.

Further, in the gas nozzles 340a to 340e, the plurality of first injection holes 60a to 60e is provided along the longitudinal direction L of the gas nozzles 340a to 340e, and each of the first injection holes 60a to 60e has substantially the same opening area. Each of the second injection holes 61a to 61e has an equal (or substantially equal) opening area equal to or less than the opening area of one of the first injection holes 60a to 60e.

By making the opening areas of the first injection holes 60a to 60e equal (or substantially equal) in this way, it is easy to evenly supply the gas to the wafers 200 held in a horizontal posture in multiple stages in the vertical direction. Further, the deviation of the internal pressure of the gas nozzles 340a to 340e can be reduced by allowing each of the second injection holes 61a to 61e to have an equal (or substantially equal) opening area equal to or less than the opening area of one of the first injection holes 60a to 60e. This makes the supply amount of the gas supplied from the first injection holes 60a to 60e uniform in the longitudinal direction of the nozzle.

The expression "substantially equal opening area" means that a ratio of the smallest opening area to the largest opening area is 90% or more.

Further, the gas nozzles 340a to 340e have a run-up section S between the inlet from which the gas is supplied and a first injection holes closest to the inlet among the first injection holes 60a to 60e. A sum of the opening areas of the second injection holes 61a to 61e is set to be larger than 0% and 3% or less of the flow path cross-sectional area A of the run-up section S.

In the present embodiment, the gas nozzles 340a to 340e are long cylindrical nozzles having a constant inner diameter at each position of the gas nozzles 340a to 340e in the longitudinal direction L. Therefore, the flow path cross-sectional area A of the run-up section S is the same at each position in the longitudinal direction L. However, if the inner diameters of the gas nozzles 340a to 340e at each position in the longitudinal direction L are not constant and the flow path cross-sectional area A of the run-up section S is different at each position in the longitudinal direction L, the expression "larger than 0% and 3% or less of the flow path cross-sectional area A of the run-up section S" is changed to larger than 0% and 3% or less of the smallest flow path cross-sectional area A of the run-up section S.

In the case of a gas nozzle with a constant inner diameter, the gas flows at a velocity close to the velocity of sound in the run-up section inside the gas nozzle. In the section where the side holes (first injection holes in the present embodiment) are opened, the velocity decreases faster than the pressure toward the tip. The deviation of the internal pressure of such a gas nozzle is about 10% at the highest.

By providing the run-up section S in the gas nozzles 340a to 340e in this way, the velocity of the gas entering the formation region of the first injection holes 60a to 60e can be increased in the gas nozzles 340a to 340e, and the velocity of the gas can be easily maintained up to the tip portions of the gas nozzles 340a to 340e. This makes the supply amount of the gas supplied from the first injection holes 60a to 60e uniform in the longitudinal direction of the nozzle.

Further, by setting the sum of the opening areas of the second injection holes 61a to 61e to be larger than 0% and 3% or less of the flow path cross-sectional area A of the run-up section S, as compared with the case where the sum of the opening areas of the second injection holes 61a to 61e exceeds 3% of the flow path cross-sectional area A of the run-up section S, it is possible to suppress an excessive decrease in the internal pressure of the gas nozzles 340a to 340e and to suppress an excessive decrease in the flow velocity of the gas injected from the first injection holes 60a to 60e. This is makes the supply amount of the gas supplied from the first injection holes 60a to 60e uniform in the longitudinal direction of the nozzle.

Further, in the gas nozzles 340a to 340e, a length of the run-up section S is set to be ⅓ or more of a total length of the gas nozzles 340a to 340e.

With such a configuration, a velocity of the gas entering the formation region of the first injection holes 60a to 60e can be increased in the gas nozzles 340a to 340e, and the velocity of the gas can be easily maintained up to the tip portions of the gas nozzles 340a to 340e. This makes the supply amount of the gas supplied from the first injection holes 60a to 60e uniform in the longitudinal direction of the nozzle.

[Gas Supply Pipes 310a to 310e]

As shown in FIGS. 1 and 2, the gas supply pipe 310a communicates with the gas nozzle 340a via the nozzle support portion 350a. The gas supply pipe 310b communicates with the gas nozzle 340b via the nozzle support portion 350b. The gas supply pipe 310c communicates with the gas nozzle 340c via the nozzle support portion 350c. The gas supply pipe 310d communicates with the gas nozzle 340d via the nozzle support portion 350d. The gas supply pipe 310e communicates with the gas nozzle 340e via the nozzle support portion 350e.

In the gas supply pipe 310a, an inert gas supply source 360a for supplying an inert gas as a processing gas, a mass flow controller (MFC) 320a, which is an example of a flow rate controller, and a valve 330a, which is an opening/closing valve, are installed sequentially from the upstream side in the gas flow direction. Examples of the inert gas include a nitrogen ($N_2$) gas.

In the gas supply pipe 310b, a first reaction gas supply source 360b for supplying a first reaction gas as a processing gas, an MFC 320b, and a valve 330b are installed sequentially from the upstream side. Examples of the first reaction gas include a mixed gas of ozone ($O_3$) and oxygen ($O_2$).

Further, a gas supply pipe 310f for supplying an inert gas is connected to the gas supply pipe 310b on a downstream side of the valve 330b. In the gas supply pipe 310f, an inert gas supply source 360f for supplying an inert gas as a processing gas, an MFC 320f, and a valve 330f are installed sequentially from the upstream side.

In the gas supply pipe 310c, a precursor gas supply source 360c for supplying a precursor gas as a processing gas, an MFC 320c, and a valve 330c are installed sequentially from an upstream side. Examples of the precursor gas include source gases such as aluminum (Al), silicon (Si), titanium (Ti), tantalum (Ta), tungsten (W), zirconium (Zr), and hafnium (Hf).

Further, a gas supply pipe 310g for supplying an inert gas is connected to the gas supply pipe 310c on the downstream side of the valve 330c. In the gas supply pipe 310g, an inert gas supply source 360g for supplying an inert gas as a processing gas, an MFC 320g, and a valve 330g are installed sequentially from the upstream side.

In the gas supply pipe 310d, a second reaction gas supply source 360d for supplying a second reaction gas as a processing gas, an MFC 320d, and a valve 330d are installed sequentially from the upstream side. Examples of the second reaction gas include a hydrogen ($H_2$) gas.

Further, a gas supply pipe 310h for supplying an inert gas is connected to the gas supply pipe 310d on a downstream side of the valve 330d. In the gas supply pipe 310h, an inert gas supply source 360h for supplying an inert gas as a processing gas, an MFC 320h, and a valve 330h are installed sequentially from an upstream side.

In the gas supply pipe 310e, an inert gas supply source 360e for supplying an inert gas as a processing gas, an MFC 320e, and a valve 330e are installed sequentially from the upstream side.

[Controller 280]

Figure 7:
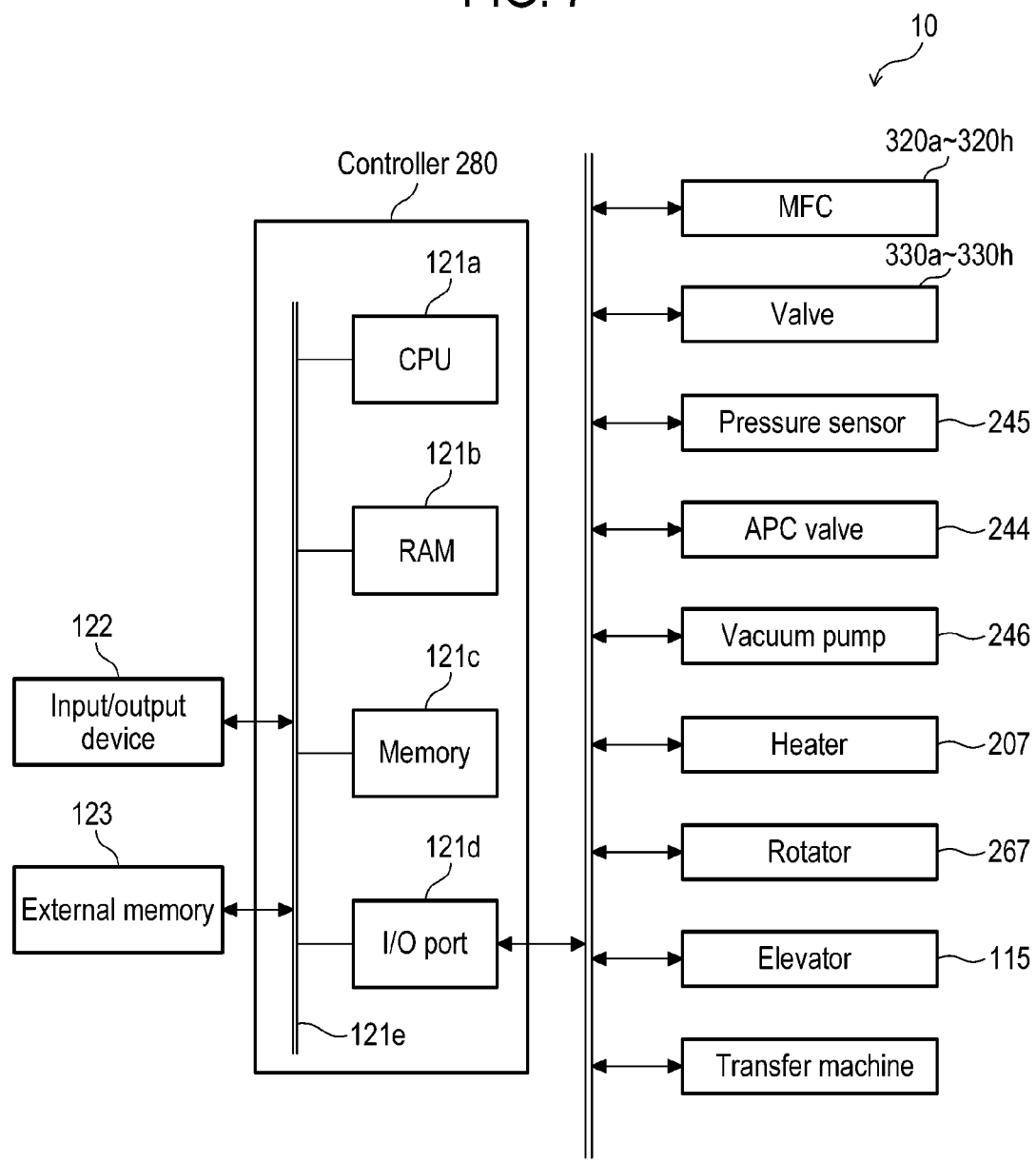
FIG. 7 is a schematic configuration diagram illustrating a control system of the substrate processing apparatus.

FIG. 7 is a block diagram showing the substrate processing apparatus 10. The controller 280 of the substrate processing apparatus 10 is configured as a computer. This computer includes a CPU (Central Processing Unit) 121a, a RAM (Random Access Memory) 121b, a memory 121c, and an I/O port 121d.

The RAM 121b, the memory 121c, and the I/O port 121d are configured to exchange data with the CPU 121a via an internal bus 121e. An input/output device 122 configured as, for example, a touch panel or the like is connected to the controller 280.

The memory 121c is composed of, for example, a flash memory, an HDD (Hard Disk Drive), or the like. The memory 121c readably stores a control program for controlling the operation of the substrate processing apparatus, a process recipe in which the procedure and conditions for a below-described substrate processing process are written, and the like.

The process recipe is configured to cause the controller 280 to execute each procedure in the below-described substrate processing process and obtain a predetermined result. The process recipe functions as a program. Hereinafter, the process recipe, the control program, etc. are collectively and simply referred to as programs.

When the term program is used in the subject specification, it may include the process recipe, the control program, or both of them. The RAM 121b is configured as a memory area (work area) in which programs, data, and the like read by the CPU 121a are temporarily held.

The I/O port 121d is connected to the MFCs 320a to 320g, the valves 330a to 330g, the pressure sensor 245, the APC valve 244, the vacuum pump 246, the heater 207, the temperature sensor, the rotator 267, the elevator 115, and the like. The CPU 121a is configured to read the control program from the memory 121c and execute the same, and is configured to read the process recipe from the memory 121c in response to the input of an operation command from the input/output device 122, or the like.

The CPU 121a is configured to perform, according to the contents of the process recipe thus read, the flow rate adjustment operation for various gases by the MFCs 320a to 320g, the opening/closing operation of the valves 330a to 330g, and the opening/closing operation of the APC valve 244.

Further, the CPU 121a is configured to control the pressure regulation operation by the APC valve 244 based on the pressure sensor 245, the start and stop of the vacuum pump 246, and the temperature adjustment operation of the heater 207 based on the temperature sensor. In addition, the CPU 121a is configured to control the rotation and rotation speed adjustment operation of the boat 217 by the rotator 267, the raising/lowering operation of the boat 217 by the elevator 115, and the like.

The controller 280 is not limited to being configured as a dedicated computer, and may be configured as a general-purpose computer. For example, the controller 280 of the present embodiment may be configured by preparing an external memory 123 in which the above-mentioned program is stored, and installing the program on a general-purpose computer using the external memory 123. Examples of the external memory include a magnetic disk such as a hard disk or the like, an optical disk such as a CD or the like, a magneto-optical disk such as an MO or the like, and a semiconductor memory such as a USB memory or the like.

[Operation]

Figure 8:
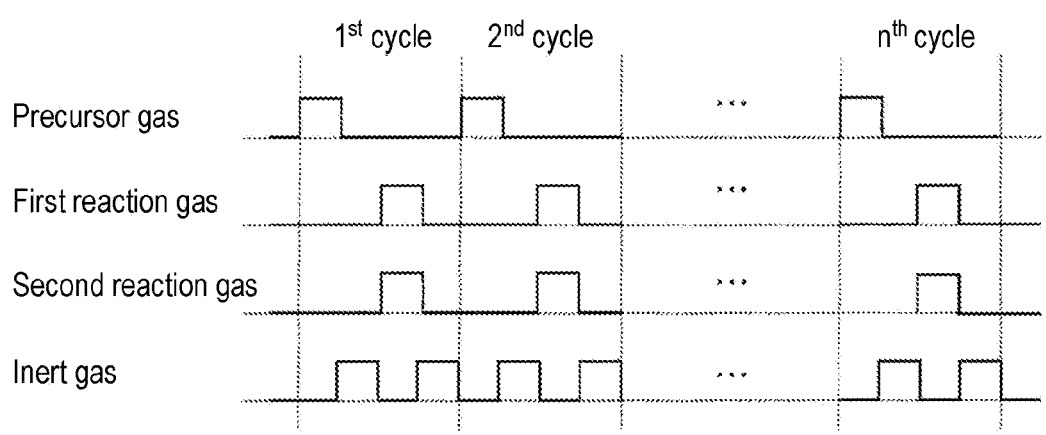
FIG. 8 is a diagram showing a film-forming sequence of the substrate processing apparatus.

Next, an outline of the operation of the substrate processing apparatus according to the present disclosure will be described using a film-forming sequence shown in FIG. 8 according to the control procedure performed by the controller 280. FIG. 8 is a graph showing the gas supply amount (vertical axis) and the gas supply timing (horizontal axis) in the film-forming sequence according to the present embodiment. The boat 217 on which a predetermined number of wafers 200 are mounted in advance is loaded into the reaction tube 203. The reaction tube 203 is airtightly closed by the seal cap 219.

[Wafer Charging and Boat Loading]

A plurality of wafers 200 is charged into the boat 217 (wafer charging). Thereafter, as shown in FIG. 1, the boat 217 supporting the plurality of wafers 200 is raised by the boat elevator 115 and loaded into the process chamber 201

(boat loading). In this state, the seal cap 219 seals the lower end of the reaction tube 203 via the O-ring 220.

[Pressure Regulation and Temperature Adjustment]

The inside of the process chamber 201 is evacuated (depressurized) by the vacuum pump 246 so that the inside of the process chamber 201, i.e., the space where the wafers 200 exist, has a desired pressure (vacuum degree). At this time, the pressure in the process chamber 201 is measured by the pressure sensor 245, and the APC valve 244 is feedback-controlled based on the measured pressure information. Further, the wafers 200 in the process chamber 201 are heated by the heater 207 so as to have a desired temperature. At this time, the supply of electric power to the heater 207 is feedback-controlled based on the temperature information detected by the temperature sensor (not shown) so that the inside of the process chamber 201 has a desired temperature distribution. In addition, the rotation of the wafers 200 by the rotator 267 is started. The evacuation of the process chamber 201, and the heating and rotation of the wafers 200 are all continuously performed at least until the processing of the wafers 200 is completed.

[Film-Forming Step]

Thereafter, the following steps 1 to 4 are sequentially executed.

(Step 1)

First, a precursor gas is supplied to the wafers 200 in the process chamber 201. As the precursor gas, for example, a source gas such as aluminum (Al), silicon (Si), titanium (Ti), tantalum (Ta), tungsten (W), zirconium (Zr), or hafnium (Hf) may be used.

Specifically, the valve 330c is opened to allow the precursor gas to flow into the gas supply pipe 310c. The flow rate of the precursor gas is adjusted by the MFC 320c. The precursor gas is supplied into the process chamber 201 via the gas nozzle 340c. The precursor gas is injected from the first injection holes 60c and the second injection holes 61c installed in the gas nozzle 340c, supplied into the process chamber 201, and then exhausted from the exhaust pipe 231.

As a result, the precursor gas is supplied to the wafers 200, and a layer containing the elements contained in the precursor gas is installed on the surface of each of the wafers 200.

At this time, the valves 330a, 330e, 330f, 330g and 330h may be opened to allow an inert gas to flow into the gas supply pipes 310a to 310e. The inert gas is a nitrogen ($N_2$) gas. In this case, the flow rate of the inert gas is adjusted by the MFC 320a, 320e, 320f, 320g and 320h, and the inert gas is supplied into the process chamber 201 via the gas nozzles 340a to 340e.

After forming the layer containing the elements contained in the precursor gas on the surface of each of the wafers 200, the valve 320c is closed to stop the supply of the precursor gas into the process chamber 201.

(Step 2)

Next, the inside of the process chamber 201 is evacuated to remove the gas and the like remaining in the process chamber 201 from the inside of the process chamber 201. At this time, the valves 330a, 330e, 330f, 330g and 330h are opened, the inert gas is supplied into the process chamber 201, and the inert gas is exhausted from the exhaust pipe 231. The inert gas acts as a purge gas.

(Step 3)

Next, a first reaction gas and a second reaction gas are simultaneously supplied to the wafers 200 in the process chamber 201. The first reaction gas is a mixed gas of ozone ($O_3$) and oxygen ($O_2$). The second reaction gas is a hydrogen ($H_2$) gas.

Specifically, the valves 320b and 320d are opened to allow the first reaction gas and the second reaction gas to flow into the gas supply pipes 310b and 310d, respectively. The flow rates of the first reaction gas and the second reaction gas are adjusted by the MFCs 320b and 320d, respectively. The first reaction gas and the second reaction gas are supplied into the process chamber 201 via the gas nozzles 340b and 340d, respectively. The first reaction gas is injected from the first injection holes 60b and the second injection holes 61b installed in the gas nozzle 340b, and is supplied into the process chamber 201. The second reaction gas is injected from the first injection holes 60d and the second injection holes 61d installed in the gas nozzle 340d, and is supplied into the process chamber 201. The first reaction gas and the second reaction gas are mixed and reacted in the process chamber 201, and then exhausted from the exhaust pipe 231.

As a result, the first reaction gas (the mixed gas of $O_3$ and $O_2$) and the second reaction gas ($H_2$ gas) are simultaneously and collectively supplied to the wafers 200. By simultaneously and collectively supplying the first reaction gas (the mixed gas of $O_3$ and $O_2$) and the second reaction gas (the $H_2$ gas) into the process chamber 201, these gases are thermally activated in a non-plasma manner in a heated depressurized atmosphere and are reacted with each other, thereby producing water ($H_2O$)-free oxidizing species containing oxygen such as atomic oxygen (O) or the like. Then, the layer formed on each of the wafers 200 in step 1 is oxidized mainly by the oxidizing species.

After performing the oxidizing treatment on the layer formed on the surface of each of the wafers 200, the valves 320b and 320d are closed to stop the supply of the first reaction gas and the second reaction gas into the process chamber 201.

(Step 4)

Finally, the inside of the process chamber 201 is evacuated, and the gas and the like remaining in the process chamber 201 are removed from the inside of the process chamber 201. At this time, the valves 330a, 330e, 330f, 330g and 330h are opened, the inert gas is supplied into the process chamber 201, and the inert gas is exhausted from the exhaust pipe 231. The inert gas acts as a purge gas.

[Performed a Predetermined Number of Times]

A desired oxide film can be formed on each of the wafers 200 by performing, one or more times (n times), a cycle in which the above film-forming steps are performed non-simultaneously, i.e., without synchronization. The above cycle is preferably performed a predetermined number of times. That is, it is preferred that the thickness of the layer formed per cycle is set to be smaller than the desired film thickness, and the above cycle is performed a plurality of times until the thickness of the film formed by stacking the layers reaches the desired film thickness.

[After-Purging and Atmospheric Pressure Restoration]

After the film-forming steps are completed, the valves 330a, 330e, 330f, 330g and 330h are opened to supply the inert gas into the process chamber 201. The inert gas is exhausted from the exhaust pipe 231. The inert gas acts as a purge gas. As a result, the inside of the process chamber 201 is purged, and the gas and reaction by-products remaining in the process chamber 201 are removed from the inside of the process chamber 201 (after-purging). Thereafter, the atmosphere in the process chamber 201 is replaced with the inert gas (inert gas replacement), and the pressure in the process chamber 201 is restored to the atmospheric pressure (atmospheric pressure restoration).

[Boat Unloading and Wafer Discharging]

The seal cap 219 is lowered by the boat elevator 115, and the lower end of the reaction tube 203 is opened. Then, the processed wafers 200 are unloaded from the lower end of the reaction tube 203 to the outside of the reaction tube 203 while being supported by the boat 217 (boat unloading). After the processed wafers 200 are unloaded from the reaction tube 203, they are taken out from the boat 217 (wafer discharging).

SUMMARY

As described above, the gas nozzles 340a to 340e include first injection holes 60a to 60e installed along the longitudinal direction L of the gas nozzles 340a to 340e in the section where the wafers 200 are arranged, and configured to supply gases, and a plurality of second injection holes 61a to 61e installed at the tips of the gas nozzles 340a to 340e in an area smaller than the flow path cross-sectional area A of the gas nozzles 340a to 340e so as to be opened obliquely to the longitudinal direction L.

By forming the plurality of second injection holes 61a to 61e at the tips of the gas nozzles 340a to 340e in this way, while preventing the gas from staying in the vicinity of the tips of the gas nozzles 340a to 340e, the supply amount of the gas supplied from the first injection holes 60a to 60e can be made uniform in the longitudinal direction of the nozzles without changing the diameters of the first injection holes 60a to 60e from the conventional configuration.

Further, by forming the plurality of second injection holes 61a to 61e at the tips of the gas nozzles 340a to 340e, it is possible to reduce the internal pressure of the gas nozzles 340a to 340e. Therefore, even when ozone ($O_3$) is supplied from the gas nozzles 340a to 340e, the attenuation of ozone ($O_3$) can be suppressed and the supply amount of ozone ($O_3$) can be made uniform in the longitudinal direction of the nozzles.

Further, by forming the second injection holes 61a to 61e so as to be opened obliquely to the longitudinal direction L, the gas flow is deflected in the second injection holes 61a to 61e, and a flow velocity can be slowed down even if the opening area is the same as when the second injection holes 61a to 61e are opened perpendicularly to the longitudinal direction L. As a result, it is possible to suppress an excessive decrease in the internal pressure of the gas nozzles 340a to 340e and an excessive decrease in the flow velocity of the gas injected from the first injection holes 60a to 60e. Therefore, the supply amount of the gas supplied from the first injection holes 60a to 60e can be made uniform in the longitudinal direction of the nozzles.

Further, the tips of the gas nozzles 340a to 340e are installed of a hemispherical ceiling, and the second injection holes 61a to 61e are arranged at positions other than the tips of the ceiling in a rotationally symmetric manner with the longitudinal direction L as a symmetry axis.

With such a configuration, the deviation of the internal pressure of the gas nozzles 340a to 340e can be reduced, which makes the supply amount of the gas supplied from the first injection holes 60a to 60e uniform in the longitudinal direction of the nozzles.

Further, in the gas nozzles 340a to 340e, the plurality of first injection holes 60a to 60e is provided along the longitudinal direction L of the gas nozzles 340a to 340e, and each of the first injection holes 60a to 60e has substantially the same opening area. Each of the second injection holes 61a to 61e has an equal (or substantially equal) opening area equal to or less than the opening area of one of the first injection holes 60a to 60e.

By making the opening areas of the first injection holes 60a to 60e equal (or substantially equal) in this way, it is easy to evenly supply the gas to the wafers 200 held in a horizontal posture in multiple stages in the vertical direction.

Further, the deviation of the internal pressure of the gas nozzles 340a to 340e can be reduced by allowing each of the second injection holes 61a to 61e to have an equal (or substantially equal) opening area equal to or less than the opening area of one of the first injection holes 60a to 60e. This makes the supply amount of the gas supplied from the first injection holes 60a to 60e uniform in the longitudinal direction of the nozzles.

Further, the process chamber 201 includes nozzle chambers 222 configured to accommodate the gas injectors 50a to 50e. With such a configuration, it is possible to prevent the gas from being mixed between the nozzle chambers 222.

Further, the gas nozzles 340a to 340e have a run-up section S between the inlet from which the gas is supplied and a first injection hole closest to the inlet among the first injection holes 60a to 60e. A sum of the opening areas of the second injection holes 61a to 61e is set to be larger than 0% and 3% or less of the flow path cross-sectional area A of the run-up section S.

By providing the run-up section S in the gas nozzles 340a to 340e in this way, the velocity of the gas entering the formation region of the first injection holes 60a to 60e can be increased in the gas nozzles 340a to 340e, and the velocity of the gas can be easily maintained up to the tip portions of the gas nozzles 340a to 340e. This makes the supply amount of the gas supplied from the first injection holes 60a to 60e uniform in the longitudinal direction of the nozzle.

Further, by setting the sum of the opening areas of the second injection holes 61a to 61e to be larger than 0% and 3% or less of the flow path cross-sectional area A of the run-up section S, as compared with the case where the sum of the opening areas of the second injection holes 61a to 61e exceeds 3% of the flow path cross-sectional area A of the run-up section S, it is possible to suppress an excessive decrease in the internal pressure of the gas nozzles 340a to 340e and to suppress an excessive decrease in the flow velocity of the gas injected from the first injection holes 60a to 60e. This makes the supply amount of the gas supplied from the first injection holes 60a to 60e uniform in the longitudinal direction of the nozzle.

Further, in the gas nozzles 340a to 340e, the length of the run-up section S is set to be ⅓ or more of the total length of the gas nozzles 340a to 340e.

With such a configuration, the velocity of the gas entering the formation region of the first injection holes 60a to 60e can be increased in the gas nozzles 340a to 340e, and the velocity of the gas can be easily maintained up to the tip portions of the gas nozzles 340a to 340e. This makes the supply amount of the gas supplied from the first injection holes 60a to 60e uniform in the longitudinal direction of the nozzles.

<Modification 1>

The shape of the gas nozzle is not limited to the long nozzle having a closed tip and a constant inner diameter as shown in FIG. 3. As in the gas nozzle 340f shown in FIG. 9, the inner diameter of the gas nozzle may decrease from the inlet to the tip, and may be expanded in a spherical shape at the tip portion 65.

The gas nozzle 340f includes a plurality of first injection holes 60f installed along the longitudinal direction L of the gas nozzle 340f, and a plurality of second injection holes 61f installed at the tip portion 65 of the gas nozzle 340f.

In the gas nozzle 340f, instead of forming the plurality of second injection holes 61f at the tip portion 65, the tip portion 65 may be made of porous quartz.

<Modification 2>

When a hole opened in the longitudinal direction of the gas nozzle exists at the tip of the gas nozzle, it is preferable that the opening area of the hole is smaller than the opening area of each of the second injection holes.

With such a configuration, it is possible to reduce the amount of the gas injected from the opening in the longitudinal direction of the gas nozzle at a high flow velocity. This makes it possible to suppress an excessive decrease in the internal pressure of the gas nozzles and an excessive decrease in the flow velocity of the gas injected from the first injection holes. Therefore, the supply amount of the gas supplied from the first injection holes can be made uniform in the longitudinal direction of the nozzles.

Although various typical embodiments of the present disclosure have been described above, the present disclosure is not limited to those embodiments and may be appropriately modified without departing from the spirit of the present disclosure. For example, the shape of the tip of the gas nozzle is not limited to the hemispherical shape, and may be a polyhedron shape, a shape bulging upward by a combination of a flat surface and a curved surface, a completely flat shape, or a concave shape.

For example, the substrate processing apparatus according to the embodiment of the present disclosure can be applied not only to the semiconductor manufacturing apparatus for manufacturing a semiconductor but also to an apparatus for processing a glass substrate such as an LCD device or the like. Further, the processing for the substrate includes, for example, CVD, PVD, a process for forming an oxide film or a nitride film, a process for forming a film containing a metal, an annealing process, an oxidizing process, a nitriding process, a diffusion process, and the like. Needless to say, the present disclosure can also be applied to various substrate processing apparatuses such as an exposure apparatus, a coating apparatus, a drying apparatus, and a heating apparatus.

According to the present disclosure in some embodiments, it is possible to make the supply amount of a gas uniform in the longitudinal direction of a pipe of a gas injector in a process chamber.

While certain embodiments have been described, these embodiments have been presented by way of example, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
    a process container where a plurality of substrates to be processed is arranged in an inside of the process container; and
    a gas injector including a pipe extending along a direction in which the plurality of substrates is arranged, and configured to supply a gas into the process container,
    wherein the gas injector includes:
        at least one first injection hole installed along a longitudinal direction of the pipe in a section where the plurality of substrates is arranged, and configured to supply the gas; and
        a plurality of second injection holes having an area smaller than a flow path cross-sectional area of the pipe, and installed to be opened obliquely to the longitudinal direction at a tip of the pipe,
    wherein the tip of the pipe is formed of a hemispherical ceiling, and
    wherein the plurality of second injection holes is formed on the ceiling and is arranged at positions other than a tip of the ceiling in a rotationally symmetric manner with the longitudinal direction as a symmetry axis.

2. The substrate processing apparatus of claim 1, wherein the at least one first injection hole includes a plurality of first injection holes,
    each of the plurality of first injection holes has a substantially equal opening area and is installed along the longitudinal direction of the pipe, and
    each of the plurality of second injection holes has a substantially equal opening area equal to an opening area of one of the plurality of first injection holes.

3. The substrate processing apparatus of claim 1, wherein the at least one first injection hole includes a plurality of first injection holes,
    the plurality of first injection holes is installed along the longitudinal direction of the pipe, and
    the process container includes an injector chamber configured to accommodate the gas injector.

4. The substrate processing apparatus of claim 1, wherein the pipe has a run-up section between an inlet from which a gas is supplied and a first injection hole closest to the inlet among the at least one first injection hole, and
    a sum of opening areas of the plurality of second injection holes is larger than 0% and 3% or less of a flow path cross-sectional area of the run-up section.

5. The substrate processing apparatus of claim 1, wherein the tip of the pipe includes a hole opened toward the longitudinal direction, and
    wherein an opening area of the hole is smaller than an opening area of any of the plurality of second injection holes.

6. The substrate processing apparatus of claim 1, wherein the pipe has a run-up section between an inlet from which a gas is supplied and a first injection hole closest to the inlet among the at least one first injection hole, and
    a length of the run-up section is ⅓ or more of a total length of the pipe.

7. The substrate processing apparatus of claim 3, further comprising supply ports configured to allow fluid communication between an inside of the injector chamber and the inside of the process container,
    wherein the supply ports are opened at positions in the longitudinal direction at which the plurality of first injection holes is installed.

8. The substrate processing apparatus of claim 7, wherein the process container includes an inner tube and an outer tube, and the injector chamber is installed between the inner tube and the outer tube.

9. The substrate processing apparatus of claim 8, wherein the supply ports are installed in a one-to-one correspondence relationship with the plurality of first injection holes, and
    an opening for bringing the inside of the injector chamber into direct communication with the inside of the process container is not installed on a tip side of a supply port corresponding to a first injection hole installed on a most tip side of the pipe in the longitudinal direction among the plurality of first injection holes.

10. The substrate processing apparatus of claim 8, wherein the supply ports are installed in a one-to-one correspondence relationship with the plurality of substrates, and an opening for bringing the inside of the injector chamber into direct communication with the inside of the process container is not formed on an end side of a supply port installed on a most end side of the pipe in a direction in which the plurality of substrates are arranged.

11. The substrate processing apparatus of claim 2, wherein an opening diameter of each of the plurality of second injection holes is substantially equal to an opening diameter of one of the plurality of first injection holes.

12. The substrate processing apparatus of claim 1, wherein the pipe has a run-up section between an inlet from which a gas is supplied and a first injection hole closest to the inlet among the at least one first injection hole, and in a section of the pipe where the at least one first injection hole is installed, a velocity of the gas decreases faster than a pressure of the gas toward the tip of the pipe.

13. A method of manufacturing a semiconductor device, comprising:

loading a plurality of substrates into a process container of a substrate processing apparatus that comprises the process container, a substrate holder arranged inside the process container and configured to arrange and hold the plurality of substrates, and a gas injector including a pipe extending along a direction in which the plurality of substrates is arranged and configured to supply a gas into the process container, the gas injector including at least one first injection hole installed along a longitudinal direction of the pipe in a section where the plurality of substrates is arranged, and configured to supply the gas, and a plurality of second injection holes having an area smaller than a flow path cross-sectional area of the pipe, and installed to be opened obliquely to the longitudinal direction at a tip of the pipe, wherein the tip of the pipe is formed of a hemispherical ceiling, and wherein the plurality of second injection holes is formed on the ceiling and is arranged at positions other than a tip of the ceiling in a rotationally symmetric manner with the longitudinal direction as a symmetry axis; and processing the plurality of substrates.

14. A method of processing a substrate using the substrate processing apparatus of claim 1, comprising:

loading plurality of substrates into the process container; and processing the plurality of substrates.

* * * * *